ELECTRICAL CIRCUIT HAVING PULSE OUTPUT WITH DURATION PROPORTIONAL TO INPUT SIGNAL

Filed Dec. 22, 1966

KENNETH E. NELSON
INVENTOR.

BY David E. Hoppe
ATTORNEY 3,517,212

ELECTRICAL CIRCUIT HAVING PULSE OUTPUT WITH DURATION PROPORTIONAL TO INPUT SIGNAL

Kenneth E. Nelson, North Attleboro, Mass., assignor to The Foxboro Company, Foxboro, Mass., a corporation of Massachusetts Filed Dec. 22, 1966, Ser. No. 603,931
Int. Cl. H03k 4/08
U.S. Cl. 307—228 7 Claims

ABSTRACT OF THE DISCLOSURE

A transistorized electrical circuit which produces a constant-amplitude pulse output having a duration proportional to the integrated value of an input signal.

For a variety of applications, it is desirable to have a means of producing a pulse having a length proportional to some characteristic of an input signal. This invention provides circuit means for making the output pulse duration proportional to the integral of the amplitude of an input signal, this integral being the instantaneous amplitude effectively summed over the duration of the input signal. A constant-amplitude pulse input signal will produce an output pulse having a duration with a fixed ratio to the input duration. The embodiments described below are designed to provide a ratio between the pulse output duration and the pulse input duration in the range of from 1,000 to 100,000 according to the application requirements. Such an application may be termed pulse stretching, inasmuch as the output pulse is longer than the input pulse by a preselected factor.

Accordingly, the invention provides a transistor circuit for producing a pulse output having a proportional relationship to an input signal. The circuit of the invention will also operate upon pulse trains, such as from a computer, so that successive pulses occurring within the interval of a normal output pulse will extend the output pulse duration and make it proportional to the sum of the said successive input pulse durations.

These and other features of the invention will be in part apparent from the following description and in part from the claims appended hereto.

Figure 1:
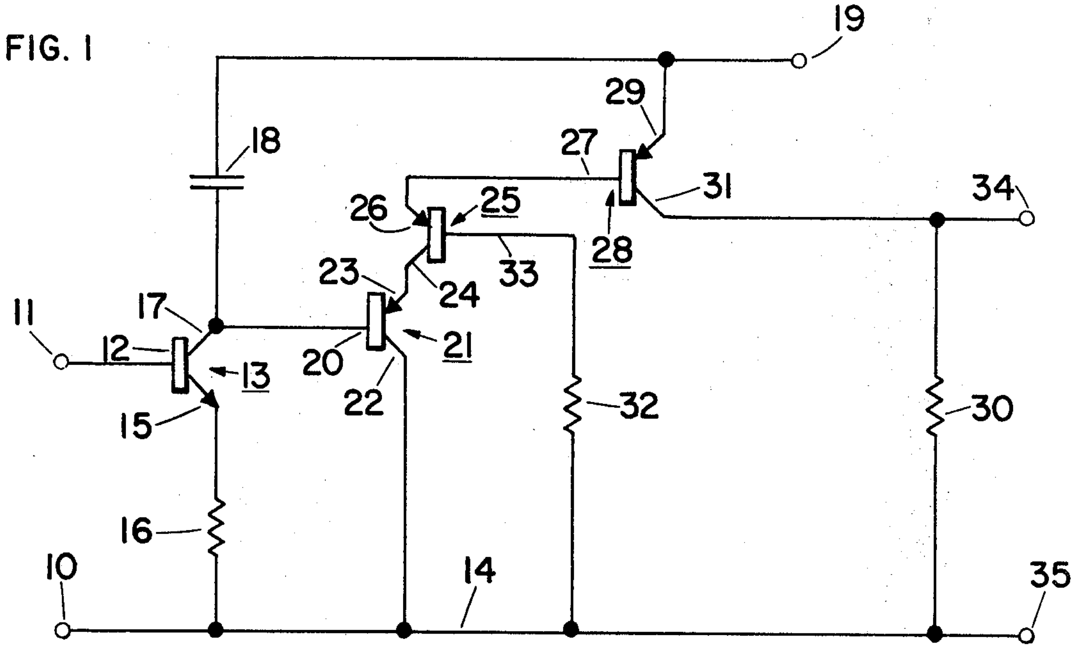
FIG. 1 is a simplified embodiment of the invention.

Referring to FIG. 1, an input signal, illustratively a waveform consisting of a constant-amplitude pulse with a variable duration, is applied to input terminals 10 and 11, with the positive polarity of the input signal going to terminal 11. Terminal 11 is connected to base 12 of transistor 13, and terminal 10 is connected to common reference 14 of the transistor circuit. Emitter 15 of transistor 13 is connected through resistor 16 to common reference 14, and collector 17 of transistor 13 is connected through capacitor 18 to a positive power supply potential supplied to terminal 19.

The positive-going leading edge of the input pulse signal turns transistor 13 on, thereby establishing a charging path for capacitor 18 in which the charging current flows from terminal 19 through capacitor 18, through the collector-emitter path of transistor 13, and through resistor 16 to common reference 14.

In the case of the constant-amplitude input signal having a particular peak potential, the potential on base 12 during the pulse interval, and hence the potential at emitter 15 during the pulse interval, will be substantially this particular potential. Under this condition, the current through emitter resistor 16 is substantially constant during the input pulse duration. This constant current, flowing through the collector-emitter circuit of transistor 13, provides a constant-current charging of capacitor 18. While the charging current through capacitor 18 is constant, the potential at collector 17 of transistor 13 ramps linearly downward from the supply potential appearing at terminal 19; this phase of operation is terminated when the input pulse duration ends and transistor 13 is turned off by the negative-going trailing edge of the input pulse signal. In this manner, the potential at collector 17 of transistor 13 falls linearly from an initial high supply potential to some lower potential, the potential difference being proportional to the pulse input duration. It should be noted that this portion of the operating cycle of the circuit is a very small fraction of the pulse output duration, the pulse output having a duration many magnitudes more than the pulse input duration.

The fall in the potential of collector 17 of transistor 13 initiates the output pulse. Collector 17 of transistor 13 is connected to base 20 of transistor 21. Collector 22 of transistor 21 is connected to common reference 14, emitter 23 of transistor 21 is connected to collector 24 of transistor 25, the emitter 26 of transistor 25 is connected to the base 27 of transistor 28, and the emitter 29 of transistor 28 is connected to supply terminal 19. A falling potential applied to base 20 of transistor 21 forward biases the base-emitter junction of transistor 21. The base-emitter junctions of serially connected transistors 21, 25 and 28 consequently are all forward-biased, so that all three transistors are turned on. When transistor 28 is on the supply potential at terminal 19 appears across output load resistor 30, which is connected between collector 31 of transistor 28 and the common reference 14, thereby initiating the pulse output interval. Output terminal 34 is connected to the collector 31 side of load resistor 30 and output terminal 35 is connected to common reference 14.

A linear discharge of capacitor 18 is effectively the result of the constant current supplied by the action of transistors 21 and 25. Resistor 32 is connected between base 33 of transistor 25 and common reference 14. Since the base-emitter drops of transistors 25 and 28 are negligible, base 33 of transistor 25 is substantially close to the supply potential at terminal 19. Therefore, the potential across resistor 32 is substantially constant when transistors 25 and 28 are on, and it follows that the current through resistor 32 is also substantially constant. With a constant potential on base 33 of transistor 25, the collector-emitter current through transistor 25 is also substantially constant. Thus the current through the transistor 25 collector-emitter path will be substantially constant during the time transistors 21, 25, and 28 are on, even though the potential at collector 24 of transistor 25 may change. The value of this constant current through the collector-emitter path of transistor 25 is equal to the constant current flowing through the base resistor 32 multiplied by the current amplification ratio between the collector and the base of transistor 25. This constant current from collector 24 of transistor 25 flows into emitter 23 of transistor 21, that portion of which flowing from base 20 discharges capacitor 18. This discharge current from base 20 is a constant current which is equal to the constant current flowing into emitter 23 divided by one plus the current amplification ratio of transistor 21. The plus 1 factor refers the current amplification ratio to the emitter circuit.

The capacitor 18 discharge current is thus regulated at a relatively small constant-current value owing to the current division through transistor 21, so that the discharge time for capacitor 18 is very much longer than its charging time.

Eventually capacitor 18 discharges sufficiently to allow the potential at base 20 of transistor 21 to rise to a level making the forward bias of transistor 21 insufficient to maintain current therethrough. At this time transistors 21, 25 and 28 are turned off and the output pulse terminates, returning terminal 34 to a potential equivalent to the potential at common reference 14.

The ratio of output pulse duration to input pulse duration may be varied by varying the value of resistor 32, which determines the value of discharge current through capacitor 18.

The pulse output of the circuit of FIG. 1 begins when the potential at base 20 of transistor 21 falls to a sufficiently low value to cause output transistor 28 to conduct. Thus there is a finite time between the leading positive-edge of the input pulse and the initiation of the output pulse. Also the output pulse termination may occur at a time capacitor 18 is becoming non-linearly discharged being near the end of its discharge. In order to provide a more definite leading and trailing edge of the output pulse, and more particularly, to initiate the output pulse more closely to the occurrence of the positive-going leading edge of the input pulse and end the output pulse when capacitor 18 is at the end of its linear discharge, the circuit of FIG. 2 incorporates means for accomplishing these ends.

Figure 2:
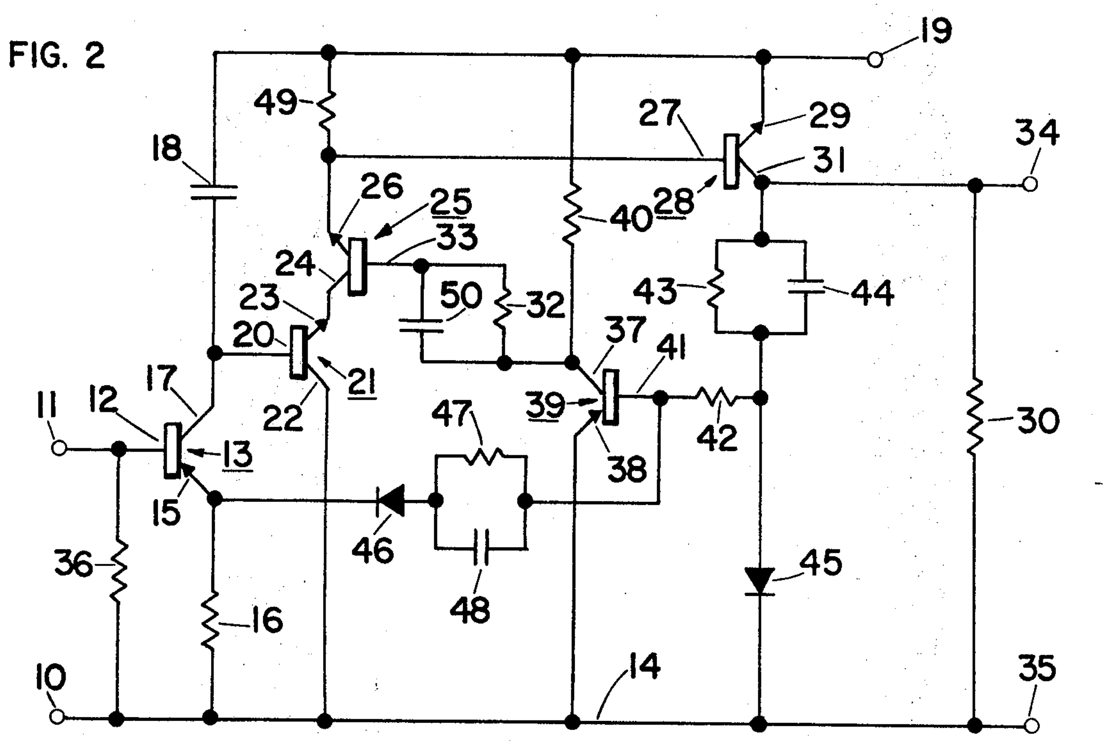
FIG. 2 is an embodiment of the invention incorporating means for providing more precise definition of the output pulse.

To facilitate comparison of FIG. 2 with FIG. 1, the components performing the same functions of FIG. 1 are similarly numerically designated. It is to be noted the polarities of the circuit of FIG. 2 are reversed as compared with those of FIG. 1; the power supply potential at terminal 19 is negative, the input pulse is negative at terminal 11, the output pulse is negative at terminal 34 and the like numbered transistors are of opposite types of those of FIG. 1, to accord with the general polarity reversal. Additional components not appearing in FIG. 1 are sequentially designated by numbers beginning with 36.

Resistor 36 is placed between the terminals 11 and 12 for providing a constant load to the preceding circuit providing the pulse input signal, thereby improving operational stability.

Resistor 32 from base 33 of transistor 25 is returned to common reference 14 by way of collector 37—emitter 38 path of transistor 39. Transistor 39 is effectively an amplifier, collector 37 being connected through load resistance 40 to negative power supply terminal 19; base 41 of transistor 39 is responsive to the amplitude of the output pulse appearing at terminal 34, base 41 being connected thereto through decoupling resistance 42 and the parallel combination of resistor 43 and capacitor 44. During the time the output pulse appears, transistor 39 is normally turned on by the negative pulse potential at output terminal 34, which is coupled to base 41 through the serial combination of resistors 43 and 42. At the time the output pulse begins to terminate, the initial change in amplitude of the output pulse appearing at terminal 34 is coupled through capacitor 44 and decoupling resistor 42 to base 41, turning transistor 39 off immediately upon such first initial change. Transistor 39 thereupon isolates base resistor 32 from reference 14 and quickly disables the capacitor 18 discharging circuitry leaving a small residual charge on capacitor 18; the output pulse is then definitely terminated.

Diode 45 is connected from the junction of decoupling resistor 42 and resistor 43 to reference 14 in order to protect the base-emitter junction of transistor 39; diode 45 is connected to conduct at a much lower voltage than the reverse breakdown voltage of the base-emitter junction of transistor 39.

Resistor 49 is connected between base 27 and emitter 29 of transistor 28 to provide improved linearity and amplification stability.

For turning on the output pulse as close as possible to the initiation of the input pulse, diode 46 and the parallel combination of resistor 47 and capacitor 48 are connected serially between emitter 15 of transistor 13 and base 41 of transistor 39. Note resistor 42 decouples the turn-on circuit from the pulse terminating circuit previously described. The leading edge of the input pulse appearing at emitter 15 is thereby coupled to the base 41 of transistor 39, turning it on immediately, and enabling the turn-on of transistors 21, 25, and 28. Owing to the small residual charge left on capacitor 18, the turn-on of these transistors is effected quickly as compared with the turn-on of the discharging circuitry of FIG. 1.

If resistor 16 is replaced by a transistor current source given by a supply voltage, then the ratio of pulse output duration to pulse input duration is independent of the pulse input amplitude, and the output pulse duration is a constant ratio to the input pulse duration even though the input pulse duration amplitude may vary widely.

Applications of this circuit include multiplication of pulses by other pulses or constant signals, the integration or accumulation of pulses, and timing conversions. A specific application of a timing conversion that has been found particularly advantageous is time-domain interfacing between the short output intervals from a digital data processor and the larger time intervals required by any device operating in a relatively longer time domain, such as mechanical devices, valve operators, pneumatic applications, displays, and certain electrical circuits.

The pulse accumulator or counter application may be accomplished by placing a level detecting means across capacitor 18 that initiates capacitor discharge only when predetermined charging level is reached.

The circuit of FIG. 2 has been tested to perform a multiplication factor of 10,000. Input pulses with a span of 0.2–100 microseconds produce a proportional output span up to one second. The rise time of the output pulse was 60 nanoseconds while the fall time was 200 microseconds.

Transistors 21 and 25 minimize temperature effects by being operated at the same collector level and being selected of the same type.

While there has been shown what is considered to be a preferred embodiment of the invention, it will be manifest that many changes and modfiications may be made therein without departing from the essential spirit of the invention. It is intended, therefore, in the annexed claims to cover all such changes and modifications as fall within the true scope of the invention.

What is claimed is:

1. An electrical circuit for producing a pulse output therefrom having a duration related to a characteristic of an input signal to said electrical circuit comprising, electrical signal conversion means having an input responsive to said input signal and having an output related to said input signal, electrical storage means comprising a capacitor with a first terminal interconnected with said output of said electrical signal conversion means and with a second terminal connected directly to a fixed electrical potential whereby said output charges said electrical storage means during the presence of an appropriately polarized input signal at a charging rate determined by the amplitude of said input signal, current regulating means interconnected with said first terminal of said electrical storage means and being adapted to be rendered operative while said electrical storage means is in a charged condition and said current regulating means including means for supplying a discharge current while it is operative to said electrical storage means while it is in said charged condition at a substantially constant rate with said constant rate being a predetermined portion of the total current flowing through said current regulating means in its operative condition so that said discharge current is supplied to said electrical storage means over a relatively long interval following the termination of said input signal until said electrical storage means is substantially discharged and said current regulating means having an output for switching said output pulse, and switching means responsive to said output of said current regulating means for producing an output pulse while said regulating means is operative.

2. The electrical circuit for producing a pulse output of claim 1 wherein said input signal consists of pulses and said characteristic is the duration of each pulse.

3. The electrical circiut for producing a pulse output of claim 2 wherein said electrical storage means is charged substantially linearly over the duration of a pulse of said input signal.

4. The electrical circuit for producing a pulse output therefrom of claim 1 wherein said electrical signal conversion means comprises a first transistor having its base circuit responsive to said input signal, and wherein said electrical storage means comprises a capacitor interconnected between a power supply potential and the output of said first transistor, and wherein said current regultaing means comprises second and third transistors with the base circuit of said second transistor interconnected with said output of said first transistors and with the collector-emitter circuit of said second transistor interconnected with the collector-emitter circuit of said third transistor and with said third transistor having its base circuit responsive to a reference potential, and wherein said switching means comprises a fourth transistor having its base circuit responsive to said collector-emitter circuit of said third transistor and with said switching means having an output determining said pulse output from said electrical circuit.

5. The electrical circuit for producing a pulse output of claim 4 with level-detecting maesn interconnected with said capacitor and said level-detecting means having an output controlling said regulating means so that said regulating means is rendered operative to discharge said capacitor only after said capacitor is first charged to a predetermined level whereby said electrical circuit functions as a pulse accumulator.

6. The electrical circuit for producing a pulse output of claim 4 with a fifth transistor having its base circuit responsive to said pulse output and said fifth transistor having an output interconnected with said base circuit of said third transistor in a manner adapted to isolate said base circuit from said reference potential when said output pulse begins to terminate which isolation renders said regulating means inoperative and ends the discharge cycle of said capacitor thereby defining the trailing edge of said output pulse.

7. The electrical circuit for producing a pulse output of claim 6 with said base circuit of said fifth transistor being responsive to said input signal so that the leading edge of said input signal enables said fifth transistor to reestablish said base circuit of said third transistor with said reference potential which renders said regulating means operative thereby defining the leading edge of said output pulse.

References Cited

UNITED STATES PATENTS

| | | | |
|---|---|---|---|
| 2,413,063 | 12/1946 | Miller | 328—183 |
| 2,522,957 | 9/1950 | Miller | 328—183 |
| 2,602,151 | 7/1952 | Carbrey | 328—183 |
| 3,053,996 | 9/1962 | Stefanoy | 328—58 |
| 3,346,743 | 10/1967 | Strenglein | 307—267 |
| 3,364,365 | 1/1968 | Eisenhower | 307—235 |
| 3,388,266 | 6/1968 | Kjar | 307—235 |
| 3,395,293 | 7/1968 | Perloff | 307—228 |

DONALD D. FORRER, Primary Examiner

J. D. FREW, Assistant Examiner

U.S. Cl. X.R.

307—235, 267, 294